(12) United States Patent (10) Patent No.: US 11,817,870 B2
Langer et al. (45) Date of Patent: Nov. 14, 2023

(54) OSCILLATOR FREQUENCY ADJUSTMENT

(71) Applicant: RENESAS ELECTRONICS CORPORATION, Tokyo (JP)

(72) Inventors: Volker Langer, Duesseldorf (DE); Thomas Kattwinkel, Stuttgart (DE)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/265,980

(22) PCT Filed: Aug. 19, 2019

(86) PCT No.: PCT/EP2019/072168
§ 371 (c)(1),
(2) Date: Feb. 4, 2021

(87) PCT Pub. No.: WO2020/038899
PCT Pub. Date: Feb. 27, 2020

(65) Prior Publication Data
US 2021/0313996 A1 Oct. 7, 2021

(30) Foreign Application Priority Data
Aug. 20, 2018 (WO) .................. PCT/EP2018/072394

(51) Int. Cl.
*H03L 7/181* (2006.01)
*H03K 3/353* (2006.01)

(52) U.S. Cl.
CPC ............. *H03L 7/181* (2013.01); *H03K 3/353* (2013.01)

(58) Field of Classification Search
CPC .................................. H03L 7/181; H03K 3/353
(Continued)

(56) References Cited

U.S. PATENT DOCUMENTS

| 4,598,257 A | 7/1986 | Southard |
| 5,535,067 A | 7/1996 | Rooke |

(Continued)

FOREIGN PATENT DOCUMENTS

| EP | 2 237 418 A2 | 10/2010 |
| GB | 2 401 764 A | 11/2004 |
| WO | 2008/144917 A1 | 12/2008 |

OTHER PUBLICATIONS

International Search Report issued in corresponding International Patent Application No. PCT/EP2019/072168, dated Sep. 6, 2019.
(Continued)

*Primary Examiner* — Richard Tan
(74) *Attorney, Agent, or Firm* — McDermott Will & Emery LLP

(57) ABSTRACT

Oscillator circuitry is disclosed. The oscillator circuitry comprises a free-running oscillator for generating pulses at a frequency, and a frequency adjustment circuit for adaptively adjusting the frequency of the free-running oscillator. The frequency adjustment circuit comprises a counter configured to count a number of pulses generated by the free-running oscillator and logic configured to compare the number of pulses with an expected number of pulses (corresponding to a target frequency) to determine a difference value and to adjust the frequency of the free-running oscillator in dependence on the difference value. The frequency adjustment circuit is configured, in response to receiving a synchronisation pulse, to trigger an update of the number of pulses to be compared.

30 Claims, 9 Drawing Sheets

(58) Field of Classification Search
USPC .................................................... 331/108 R
See application file for complete search history.

(56) References Cited

U.S. PATENT DOCUMENTS

| | | | | |
|---|---|---|---|---|
| 5,663,688 | A * | 9/1997 | Delmas .................. | H03L 7/085 327/156 |
| 6,265,916 | B1 * | 7/2001 | Ono ...................... | H03L 7/0802 327/116 |
| 7,046,057 | B1 * | 5/2006 | Culler .................... | H03L 7/081 327/156 |
| 2007/0079166 | A1 * | 4/2007 | Okada ..................... | H03L 7/00 713/500 |
| 2007/0255971 | A1 | 11/2007 | Brooks et al. | |
| 2009/0121794 | A1 | 5/2009 | Hu et al. | |
| 2014/0375376 | A1 * | 12/2014 | Genest ................. | H03K 17/162 327/382 |
| 2018/0091158 | A1 * | 3/2018 | Sudo ........................ | H03L 7/18 |
| 2019/0296747 | A1 * | 9/2019 | Mosalikanti .............. | H03L 1/00 |
| 2020/0049747 | A1 * | 2/2020 | Antic ..................... | G01R 23/02 |

OTHER PUBLICATIONS

Notification of Transmittal of the International Search Report and the Written Opinion of the International Searching Authority, or the Declaration issued in International Patent Application No. PCT/EP2019/072168, dated Apr. 23, 2019.
Transmittal of International Preliminary Report on Patentability for PCT/EP2019/072168, dated Mar. 4, 2021.
Written Opinion of the International Searching Authority for PCT/EP2019/072168, dated Feb. 23, 2021.
European Office Action issued in corresponding European Patent Application No. 19753125.4-1205, dated Mar. 3, 2023.

* cited by examiner

OSCILLATOR FREQUENCY ADJUSTMENT

CROSS REFERENCE TO RELATED APPLICATIONS

This application is the U.S. National Phase under 35 U.S.C. § 371 of International Application No. PCT/EP2018/072168, filed on Aug. 19, 2019, which claims the benefit of International Application No. PCT/EP2018/072394, filed on Aug. 20, 2018, the entire contents of each are hereby incorporated by references.

FIELD

The present invention relates to oscillator circuitry for an integrated circuit including a free-running oscillator and a frequency adjustment circuit for adaptively adjusting the frequency of the free-running oscillator.

BACKGROUND

Integrated circuits are increasingly being deployed in large numbers in automotive, industrial and other applications. Digital and mixed-signal integrated circuits often require a local oscillator even if an integrated circuit does not have a CPU system. Often, however, these types of integrated circuits do not include high-precision oscillators (having, for example, less than 2% error). This may limit their use or require high-cost integrated circuits to be used in some systems.

EP 2 237 418 A2 describes a low-power frequency synthesiser circuit for a radio transceiver. The frequency synthesiser circuit comprises a digital controlled oscillator configured to generate an output signal having a frequency controlled by an input digital control word. The frequency synthesiser circuit also comprises a feedback loop connected between an output and an input of the digital controlled oscillator, the feedback loop configured to provide the digital control word to the input of the digital controlled oscillator from an error derived from an input frequency control word and the output signal. The frequency synthesiser circuit further comprises a duty cycle module connected to the digital controlled oscillator and the feedback loop, the duty cycle module configured to generate a plurality of control signals to periodically enable and disable the digital controlled oscillator for a set fraction of clock cycles of an input reference clock signal (RefClock).

Thus, the frequency synthesiser circuit of EP 2 237 418 A2 ibid. is a closed, digital phase-locked loop requiring a reference clock to operate in normal mode.

SUMMARY

According to a first aspect of the present invention there is provided oscillator circuitry comprising a free-running oscillator (i.e., an oscillator capable of running freely) for generating pulses at a frequency and a frequency adjustment circuit for adaptively adjusting the frequency of the free-running oscillator. The frequency adjustment circuit comprises a counter configured to count a number of pulses generated by the free-running oscillator, and logic configured to compare the number of pulses with an expected number of pulses (corresponding to a target frequency) to determine a difference value and to adjust the frequency of the free-running oscillator in dependence on the difference value. The frequency adjustment circuit is configured, in response to receiving a synchronisation pulse, to trigger an update of the number of pulses to be compared.

Thus, synchronisation pulses can be used to help the free-running oscillator reach a target frequency (or "desired frequency") without the need for an internal reference clock during normal operation. Once the desired frequency has been achieved, the oscillator can run alone.

It is possible to achieve the desired frequency with only a few synchronisation pulses and, once the desired frequency has been reached, there is no further need for synchronization pulses. Further synchronization pulses can be sent if the desired frequency needs to be re-adjusted. For example, this might occur after, for instance, 10 minutes, for instance, to compensate for a temperature change.

The counter can count the number of pulses generated by the free-running oscillator during a synchronisation period defined by successive (or "consecutive") first and second synchronisation pulses (i.e., the first synchronisation pulse and the next synchronisation pulse following the first synchronisation pulse). Thus, the number of pulses corresponds to the number of pulses generated during the synchronisation period and the frequency adjustment circuit triggers an update of the number of pulses to be compared in response to the second (and subsequent) synchronisation pulse.

A further synchronisation period can be defined by the second synchronisation pulse and a successive third synchronisation pulse or by a successive third and fourth synchronisation pulses. If two or more synchronisation periods are defined (which are preferably, successive), then this can be used to converge quickly on a desired degree of accuracy quickly (especially if the synchronisation periods are successive).

Preferably, the synchronisation pulse is from an external source. For example, if the oscillator circuitry is implemented in one monolithic integrated circuit (such as a gate driver IC), the synchronisation pulse can be generated by another, different monolithic integrated circuit (such as a microcontroller or a system-on-a-chip).

There no is reference clock which is used to dynamically control the oscillator during normal operation. For example, there is no phase-locked loop or frequency-locked loop arrangement.

The logic may further comprise a register configured to receive a counter value from the counter, to store the counter value as a stored counter value and to output the stored counter value in response to receiving the synchronisation pulse. The counter and the register may be configured such that the register continually receives the counter value from the counter.

The counter may be configured to be reset in response to receiving the synchronisation pulse. Preferably, the counter and the frequency adjustment circuit are configured such they are reset and triggered respectively in the synchronisation pulse.

The counter may be reset and/or frequency adjustment may be triggered by a rising edge of the synchronisation pulse. The counter may be reset and/or frequency adjustment may be triggered by a falling edge of the synchronisation pulse.

The oscillator circuitry may further comprise a digital input/output pin for receiving the synchronisation pulse from an external source and configured to supply the synchronisation pulse to the frequency adjustment circuit.

The oscillator may be a signal-controlled oscillator for generating pulses at a frequency which depends on a control signal. The signal-controlled oscillator may be a current-controlled oscillator or a voltage-controlled oscillator.

The logic may comprise a comparator for comparing the number of pulses with the expected number of pulses and determining the difference, and a controller for generating a control signal for the oscillator in dependence on the difference value.

The oscillator circuitry may further comprise a digital-to-analogue converter for converting a digital value of the control signal into an analogue value. The oscillator may be a digitally-controlled oscillator.

The oscillator may be an analogue-controlled oscillator.

The oscillator circuitry may further comprise an input signal processing circuit to select certain pulses or certain features of pulses from synchronisation signal so as to select one of at least two, different synchronisation periods.

Thus, different oscillator circuitry can share a common line delivering synchronisation pulses which can define two or more different synchronisation periods.

The oscillator circuitry may further comprise a sequencer configured, in response to receiving the difference value, to determine a size and/or a direction of change of frequency and to output data for generating the control signal.

According to a second aspect of the present invention there is provided an integrated circuit comprising the oscillator circuitry of the first aspect.

The integrated circuit may be a digital integrated circuit or a mixed-signal integrated circuit. The integrated circuit may be a gate driver.

According to a third aspect of the present invention there is provided a system comprising a source of a synchronisation signal containing synchronisation pulses. The source may comprise a reference oscillator and an output for a synchronisation signal, the synchronisation pulses generated using the reference oscillator. The system may comprise at least one integrated circuit (for example, at least two integrated circuits) of the second aspect of the invention. The integrated circuit (s) may be configured to receive the synchronisation signal and to use the synchronisation pulses to count the number of pulses generated by the oscillator.

Successive synchronisation pulses are preferably used to define a synchronisation period so that the number of the number of pulses counted are the number of pulses during the synchronisation period.

The source may be configured to transmit an expected value corresponding to a synchronisation period to the at least one integrated circuit. The synchronisation period may be programmable. The synchronisation period may be continuous-value variable or discrete-value variable.

The source may be configured to generate first and second sets of synchronisation pulses having first and second different synchronisation periods.

The system may comprise at least two integrated circuits having synchronised oscillators having frequencies which lie within 5%, 2% or 1%.

The source may be an integrated circuit comprising at least one processor, such as a microcontroller or a system-on-a-chip. The source may be oscillator.

According to a fourth aspect of the present invention there is provided a vehicle or plant comprising the system of the third aspect of the invention.

According to a fifth aspect of the present invention there is provided a motor vehicle comprising the system of the third aspect of the invention.

The motor vehicle may be a motorcycle, an automobile (sometimes referred to as a "car"), a minibus, a bus, a truck or lorry. The motor vehicle may be powered by an internal combustion engine and/or one or more electric motors.

According to a fifth aspect of the present invention there is provided a method of adjusting a free-running oscillator generating pulses at a frequency. The method may comprise counting a number of pulses generated by the free-running oscillator, comparing the number of pulses with an expected number of pulses to determine a difference value, adjusting the frequency of the free-running oscillator in dependence upon the difference value and, in response to receiving a synchronisation pulse, triggering an update of the number of pulses to be compared.

Adjusting frequency of the free-running oscillator may comprise generating a control signal for the oscillator in dependence on the difference value.

Generating the control signal may comprise generating a digital control signal. The method may further comprise converting the digital control signal into an analogue control signal.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
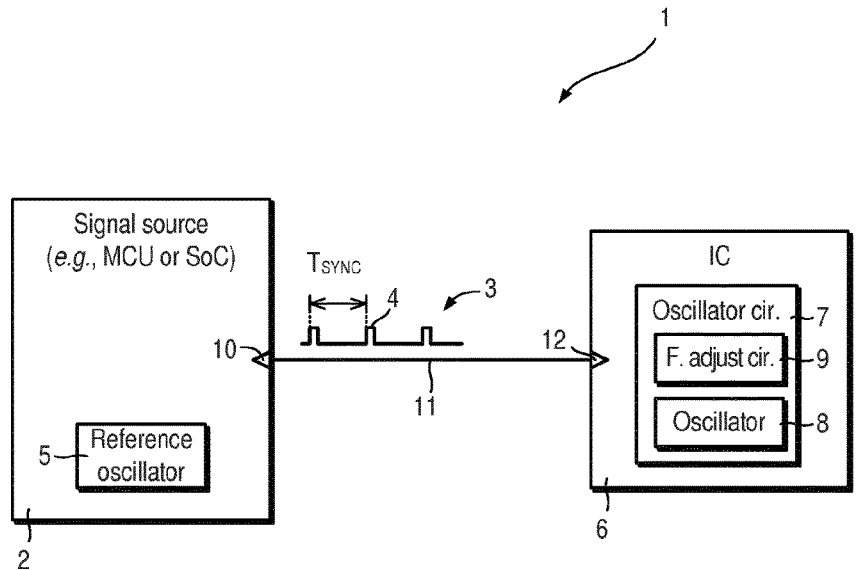
FIG. 1 is a schematic block diagram of a system comprising a source of a synchronisation signal containing synchronisation pulses, and a monolithic integrated circuit having a local oscillator whose frequency is adjusted by a frequency adjustment circuit using the synchronisation pulse.

Referring to FIG. 1, a system 1 is shown which includes a source 2 of a synchronisation signal 3 which contains synchronisation pulses 4 and having an reference oscillator 5 (herein referred to an "external oscillator" or "remote oscillator"), and a monolithic integrated circuit 6 having an oscillator circuitry 7 comprising a local oscillator 8 whose frequency can be adaptively adjusted (or "compensated" or "synchronised") by a frequency adjustment circuit 9 using the synchronisation pulses 4.

As will be explained in more detail later, the local oscillator 8 is able to run freely (or "asynchronously"), without feedback (in other words, without any active control to adjust its output frequency during normal operation). Thus, there is no need for an internal reference clock during normal operation. A free-running oscillator may be referred to as an "open-loop oscillator".

The source 2 can take the form of a microcontroller, a system-on-a-chip or other processor-based system, or a programmable crystal-controlled oscillator, phase-locked loop (PPL) frequency synthesizer, other oscillator integrated circuit or clock-generating device. The monolithic integrated circuit 6 may take the form of a digital or mixed-signal integrated circuit which does not have a CPU. For example, the monolithic integrated circuits 6 may be gate drivers for power MOSFETs or IGBTs and which are used to generate pulse width modulation (PWM) gate driver signals (not shown).

The reference oscillator 5 can take the form of a crystal oscillator or other oscillator (for example, having an accuracy less than 2%). The reference oscillator 5 is preferably more accurate than the local oscillator 8. In some embodiments, the reference oscillator 5 and the local oscillators 8 have the same or similar accuracy. The synchronisation pulses 4 are provided at a digital output 10 which may take the form of a bus interface port pin, such as Serial Peripheral Interface (SPI) port pin, or a digital output pin, such as a general-purpose input/output port pin, and is transmitted by a wired line 11 (e.g., a wired serial bus line) to an input 12, for example, which may take the form of a corresponding input to the digital output. The input 12, however, need not be specifically intended to work with the digital output 10.

The local oscillator 8 takes the form of an RS flip-flop oscillator, ring oscillator or other suitable form of oscillator capable of running freely (i.e., capable of asynchronous operation) whose frequency can be controlled using voltage or current which may be in the form of a digital signal or an analogue signal.

The local oscillator 8 is free running when the system 1 starts (this point is referred to as "start-up"). At start-up, the local oscillator 8 is not synchronised. It may have an accuracy of, for example, ±5%.

Figure 2:
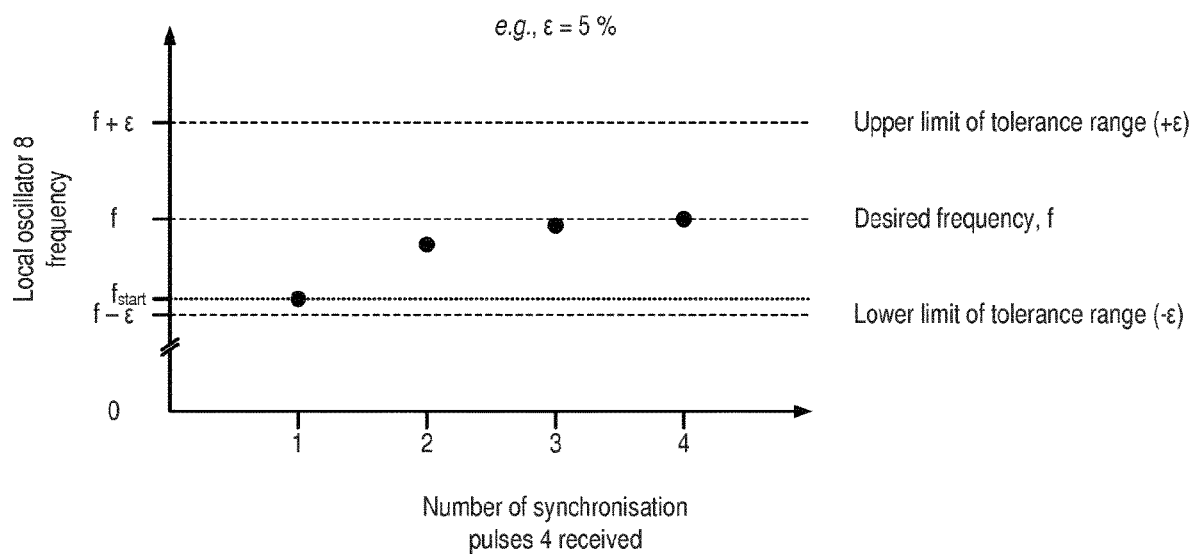
FIG. 2 schematically illustrates successive increase in accuracy of a local oscillator after receiving a series of synchronisation pulses.

Referring to FIG. 2, the accuracy of the local oscillator 8 can be successively increased by consecutive synchronisation pulses 4. As will be explained in more detail later, receiving just two synchronisation pulses 4 can greatly improve the accuracy of the local oscillator 8.

If no synchronisation pulses 4 are received, then the local oscillator 8 will run with an initial frequency with an initial (coarse) accuracy of, for example, ±5%.

Two or more synchronisation pulses 4 can be used to increase the accuracy of the local oscillator 8. If, after accuracy has been improved (e.g., to ±0.1%), no further synchronisation pulses are received, then the local oscillator 8 can still continue to run with the improved accuracy, that is, the accuracy it had after it received the last synchronisation pulse 4.

Figure 3:
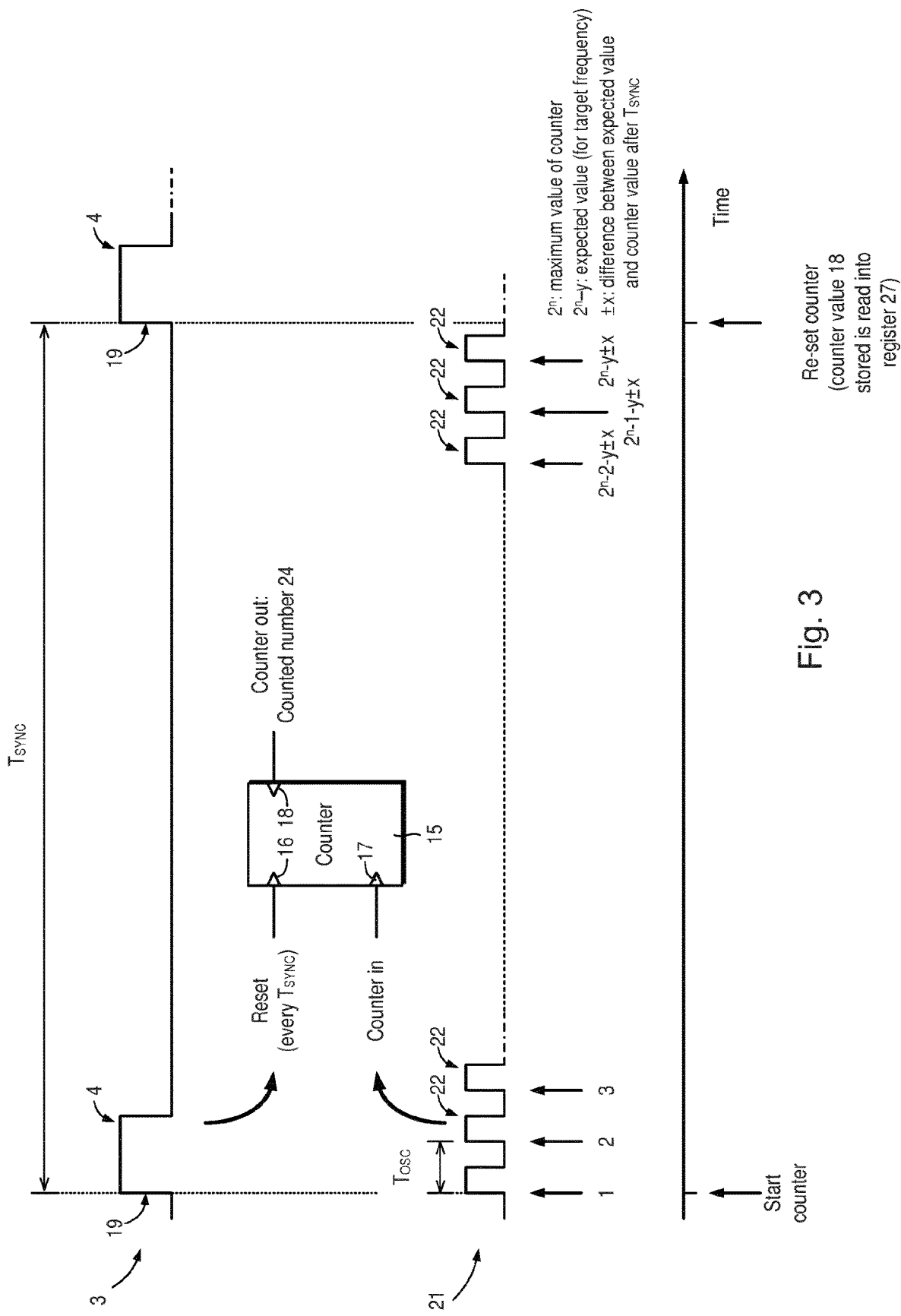
FIG. 3 is a timing diagram illustrating counting of local oscillator pulses.

Referring also to FIG. 3, the frequency adjustment circuit 9 includes a counter 15 having first and second counter inputs 16, 17 and a counter output 18.

The synchronisation signal 3 is supplied to the first counter input 16. A rising edge 19 of a synchronisation pulse 4 serves to reset the counter 15. The period of the synchronisation pulse 4 is $T_{SYNC}$ and can be tens or hundreds of microseconds, or longer. For example, the period $T_{SYNC}$ may be 500 µs. The period, $T_{SYNC}$, may be set depending on application. A local oscillator signal 21 containing pulses 22 (or "ticks") is supplied from the oscillator 8 to the first counter input 16. The oscillator pulses 22 have a period of $T_{OSC}$ which is chosen to be much smaller than $T_{SYNC}$, for example, a factor of $10^3$, $10^4$ or $10^5$ smaller than $T_{SYNC}$, and preferably (but not necessarily) chosen such that an integer number of oscillator periods, $T_{OSC}$, nominally fit in the synchronisation period, $T_{SYNC}$, i.e., $T_{SYNC}/T_{OSC}$ is an integer value.

For example, the period $T_{OSC}$ may be 50 ns, such that, for $T_{SYNC}=500$ µs, there are 10,000 oscillator pulses. As will be explained in more detail, the source 2 can be a source of more than one synchronisation pulses 4 having two or more different $T_{SYNC}$ and/or different integrated circuit 6 may select or filter different $T_{SYNC}$. For example, one set of integrated circuit(s) 6 may use only the rising edges to define a (first) period $T_{SYNC}$.

Another set of integrated circuit(s) 5 may use the rising edge 19 and the immediately following falling edge to define a (second) different period $T_{SYNC}$.

Frequency adjustment (or "compensation" or "synchronisation") is based on the counter 15 counting a number 24 of oscillator periods during the synchronisation period (herein also referred to as the "result") and comparing the result with an expected value 25 (for example, 10,000). If the result 24 is higher than expected (that is, higher than the expected value), then the oscillator frequency is decreased. Conversely, if the result is lower than expected, then the oscillator frequency is increased. The process can be repeated every cycle with the oscillator 8 being successively adjusted, as necessary.

The synchronisation pulse 4 is only necessary if accuracy of the oscillator 8 needs to increase, for example, from ±5% to, for instance, ±0.1%. If synchronisation pulses 4 are not received, then the oscillator 8 can still operate, albeit with a lower accuracy.

Figure 4:
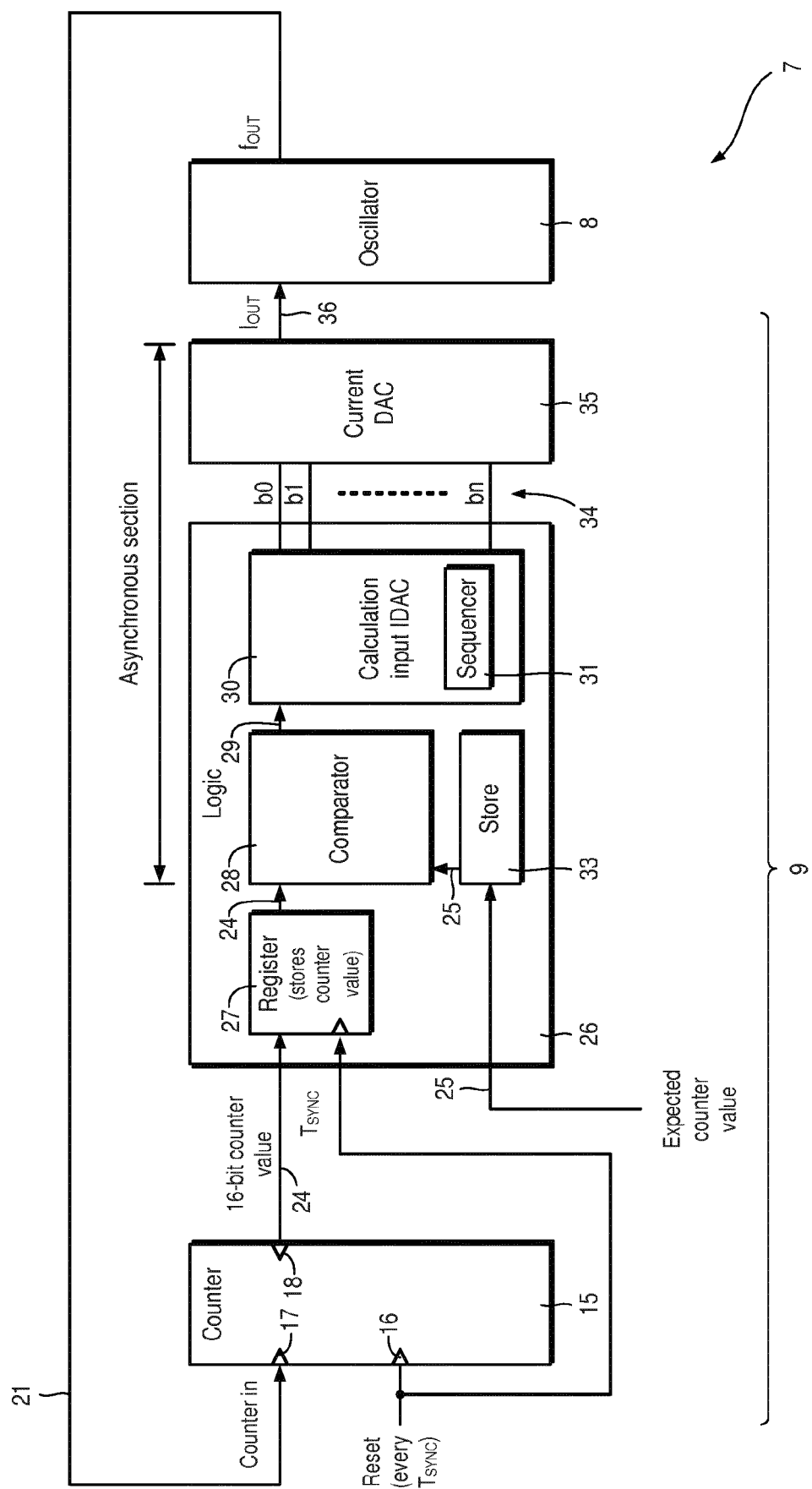
FIG. 4 is a schematic block diagram of a frequency adjustment circuit for adjusting a frequency of a local oscillator.

Referring also to FIG. 4, the oscillator circuitry 7 is shown in more detail.

The oscillator circuitry 7 includes the counter 15 which receives the signal 21 containing the oscillator pulses 22 from the oscillator 8 and the synchronisation pulses 4, which provides a periodic reset, every $T_{SYNC}$. The counter 15 continuously outputs a counter value 24 to a logic circuit 26. The counter 15 may stop when it overflows (for example, if it fails to receive one or more synchronisation pulses 4 or in case when synchronization is finalized already).

The logic circuit 26 includes a register 27 which receives the counter value 24 and the synchronisation pulses 4 which trigger readout of the register 27 and outputs the counter value 24 to a comparator 28. If no synchronisation pulse 4 is received, then no readout to the comparator 28 occurs. The counter value 24 is continually compared with the expected counter value 25 by a comparator 28 which provides a difference value 29 to a calculator 30.

The calculator 30 includes or is provided with a sequencer 31 in the form of hardware logic for determining how to change the oscillator frequency, e.g. by increasing or decreasing the frequency and, if so, by how much. The difference value 29 is provided to the sequencer 31.

As explained earlier, the counter 15 may overflow. If the counter 15 overflows, then this is an error condition which is detectable by the sequencer 31. In the event of counter overflow, the sequencer 31 can use an error handler to minimise undesired frequency change.

Figure 5:
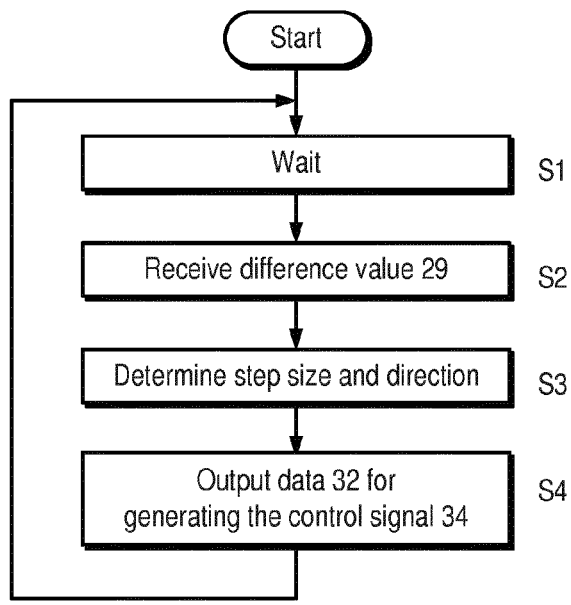
FIG. 5 is a process flow diagram of a method of operation of a sequencer.
Figure 6:
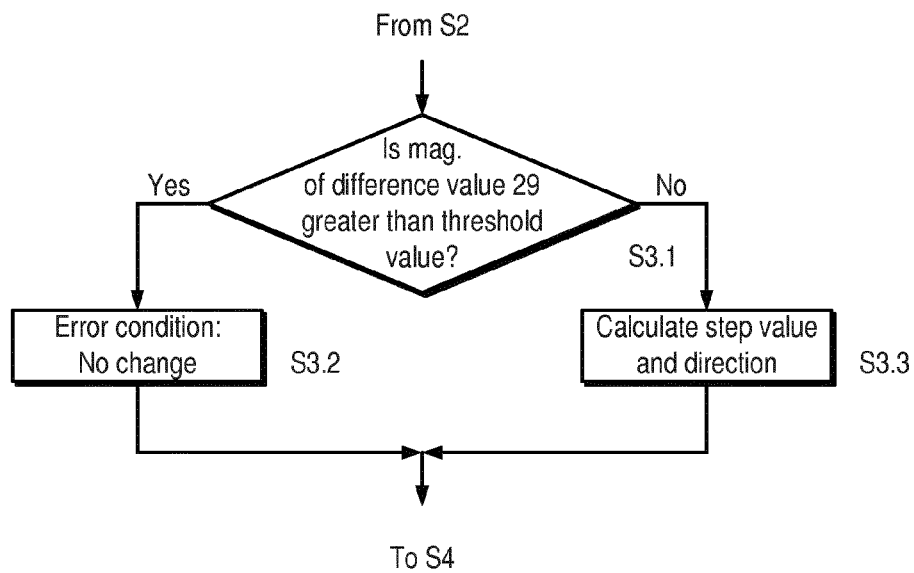
FIG. 6 is a process flow diagram illustrating a sequencer checking for an error condition.

Referring also to FIGS. 5 and 6, the sequencer 31 receives the difference value 29 (steps S1 & S2). The sequencer 31 determines a frequency-change step size and direction using the difference value 29 (step S3) and generates data 32 which the calculator can use to control the oscillator (step S4).

The sequencer 31 compares the magnitude of the difference value 29 with a pre-defined threshold value (step S3.1). The pre-defined threshold value may be hard-wired or stored in a local register (not shown) and, if stored, may be programmed. If the magnitude of the difference value 29 exceeds the threshold value, then sequencer 31 takes no action (step S3.2).

This condition arises if a counter reset does not occur due to no synchronisation pulse 4 being received. If, however, the magnitude of the difference value 29 does not exceed the threshold value, then the sequencer 31 calculates a step value and direction (i.e., increase or decrease) in dependence upon the difference value 29 (step S3.3).

Rules for determining the frequency-change step size and direction are hardcoded. Generally, the rules depend on the application and define how quickly the frequency is adjusted (e.g., adjustment within just one step, i.e., within $T_{SYNC}$).

The pre-defined threshold value may be, for example, the number of pulses corresponding to a given multiple (e.g., four times) the accuracy of the oscillator 8. Taking the example of a desired frequency of 65.53 MHz, an oscillator period of 15.26 ns, and a synchronisation period $T_{SYNC}$ of 500 μs, then the corresponding desired (or "expected") number of pulses is 32,765. If the oscillator 8 has an initial accuracy of 5%, then a 5% lower frequency corresponds to a counter value which is 1,632 lower than the desired number and a 5% higher frequency corresponds to a counter value which is 1,647 higher than the desired number. Thus, using four times the accuracy, a pre-defined threshold value may be (4×5%) which corresponds to (4×1,632)=6,528 for a lower frequency and (4×1,632)=6,588 for the lower frequency.

Two pre-defined values can be used depending on whether the counter value is higher or lower than the desired number of pulses. Alternatively, a single value may be used regardless of whether the counter value is higher or lower. The single value may be the average of the two values (which in this example would be 6,558), the lower of the two values (which in this example would be 6,528) or a suitably rounded number (which in this example could be 6,500). The pre-defined threshold value can be set for a particular application or use.

The expected counter value 25 is held in a store 33. The store 33 may take the form of a read-only store 33 (e.g., a one-time-programmable memory) holding the expected counter value 25. In other words, the expected counter value 25 may be fixed (or "hardcoded"). This assumes that a fixed, predetermined synchronisation period, $T_{SYNC}$, will be used. The expected counter value 25 may be fixed at time of manufacture or when the integrated circuit is initialised. The store 33 may take the form of a register or other form of non-volatile memory. The expected counter value 25 may be provided, for example, by the source 2 (FIG. 1) via a suitable interface (such as an SPI). Thus, the expected counter value 25 may be programmed. This allows the synchronisation period, $T_{SYNC}$, to be varied. The expected counter value can be programmed, for example, into a register (synchronized by synchronisation pulses) or hard coded.

The calculation of the frequency adjustment runs asynchronously.

The calculator 30 generates a control value 34 for setting the frequency of the oscillator 8. The control value 34 takes the form of an n-bit binary number. The binary control value 34 is fed to a digital-to-analogue converter 35 which outputs an analogue control value 36 to the oscillator 8. The digital-to-analogue converter 35 takes the form of a current digital-to-analogue converter 35. However, a voltage digital-to-analogue converter can be used. In some embodiments, a digitally-controlled oscillator can be used and so a digital-to-analogue converter can be omitted.

The rising edge 19 of a first synchronisation pulse 4 starts a calculation of a frequency and the oscillator 8 runs at a first frequency of first (coarse) accuracy. The rising edge 19 of a second, subsequent synchronisation pulse 4 (i.e., the next synchronisation pulse 4) causes the calculation of the frequency to be read out and the oscillator 8 now runs at a second frequency with second, greater accuracy. As respective rising edges 19 of a third and subsequent synchronisation pulses 4 are received, accuracy of the oscillator 8 can continue to be improved until accuracy cannot be improved any further. Even after the rising edge 19 of the first synchronisation pulse 4 is received (within a few nanoseconds), accuracy of the oscillator 8 starts to improve.

Referring still to FIGS. 3 to 6, if there is no change in difference value 29, then the data 32 output from the sequencer 31 will be the same and the calculator 30 will output the same control value 34 resulting in no change in frequency of the oscillator 8.

If the synchronisation signal 3 is interrupted such that the synchronisation period $T_{SYNC}$ is lost, then the register 27 will not change, the content of the register 27 is not output, the comparator 28 will output an out-of-range value which the sequencer 31 will ignore, resulting in no change in current from the calculation IDAC 30. Thus, the frequency of the oscillator 8 will not change.

Once a synchronisation signal 3 is re-acquired, the rising edge of the (first) synchronisation pulse 4 will result in readout of a maximum (out-of-range) value from the register 27 which will result in a large value being output by the comparator 28. This out-of-range value will be ignored by the sequencer 31. In addition to causing read of the register 27, the synchronisation pulse 4 resets the counter 15.

The counter 15 counts pulses and when the rising edge of the (second) synchronisation pulse 4 arrives, the counter value 24 stored in the register 27 will be read out and processed. Unless synchronisation period $T_{SYNC}$ is lost for a long time or there has been a significant change in operating conditions (e.g., a larger change in temperature), then the oscillator frequency is unlikely to change significantly.

The logic 26 may include a clock supervisor system (not shown) to handle circumstances when the synchronisation signal 3 is interrupted such that the synchronisation period $T_{SYNC}$ is lost and/or to handle unexpectedly high or unexpectedly low difference values which can occur if the external trigger is lost for example, if the synchronisation signal 3 is interrupted) or due to interference.

The clock supervisor system may include another comparator (not shown) interposed between the comparator 28 and the calculation input DAC module 30 to check if the difference value 29 falls within an expected range (i.e., to check if the difference value 29 is valid) and, if it falls outside the expected range (i.e., if the difference value 29 is invalid), then to use the last valid value or some other predefined value which may be stored in a register (not shown) as a substitute.

Figure 7:
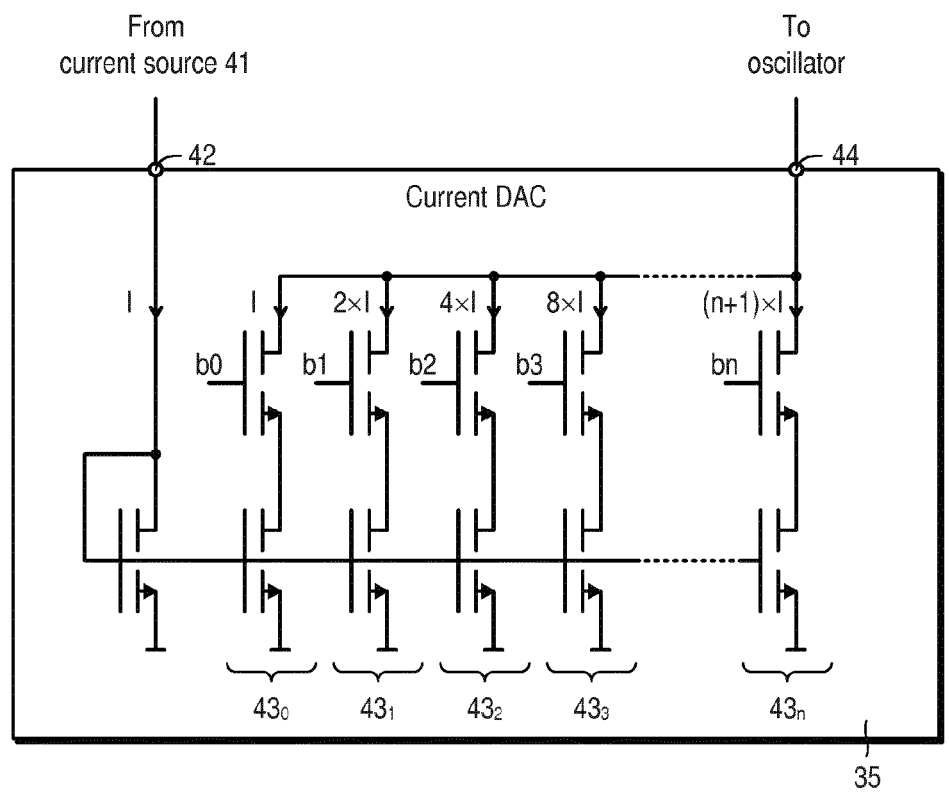
FIG. 7 is schematic diagram of a current digital-to-analogue converter.

Referring to FIG. 7, the current digital-to-analogue converter 34 receives a current I from current source 41 via terminal 42 which is used as a reference current. Current contributions I, 2×I, 4×I, 8×I, . . . , (n+1)×I are combined from respective binary-weighted current sources $43_0$, $43_1$, $43_2$, $43_3$, . . . , $43_n$ and output at analogue control signal output terminal 44. The current sources $43_0$, $43_1$, $43_2$, $43_3$, . . . , $43_n$ are controlled by respective (n+1) binary control signals b0, b1, b2, b3, . . . , bn (where b0 is the least significant bit and bn is the most significant bit).

Referring to FIGS. 4, 5, 6 and 7, an example of oscillator frequency adjustment will now be described.

The oscillator 8 is initially set to a frequency such as, for example, f=65.53 MHz with an oscillator period, $T_{OSC}$, of 15.26 ns. The oscillator 8 has a tolerance of ±5% which equates to an error in the oscillator period of ±763 μs. The period $T_{SYNC}$ is 500 μs and so the expected number of oscillator periods is (500 μs/15.26 ns)=32,765.

If the oscillator frequency is 5% higher, then the oscillator period, $T_{OSC}$, will be 14.53 ns. Thus, the number of counter ticks will be 500 μs/14.53 ns=34,412 resulting in a difference of +1647 ticks. If the oscillator frequency is 5% lower, then the oscillator period, $T_{OSC}$, will be 16.06 ns. Thus, the number of counter ticks will be 500 μs/16.06 ns=31,133 resulting in a difference of −1632.

Taking the case where the oscillator frequency is +5% too high at the beginning of the cycle (+1647 ticks). The frequency adjustment circuit 9 can, for example, reduce the oscillator current by 1,600, by adjusting bit b5, in a single step. The error is thus corrected in only one cycle (i.e., 0.5 ms) and the corrected oscillator frequency has remaining error of only 47 ticks, i.e., 47/1647×5%=0.14%.

Taking the case where the oscillator frequency is +1% too high (for example, due to a change in temperature) at the beginning of the cycle (+348 ticks). The frequency adjustment circuit 9 can reduce the oscillator current by 200 by adjusting bit b2 in a first step and then by 100 by adjusting bit b1 in a second step. The error is thus corrected in two cycles (i.e., 1.0 ms) and the corrected oscillator frequency has remaining error is 48 ticks, i.e., 48/1647×5%=0.15%.

As explained, earlier, $T_{SYNC}/T_{OSC}$ is preferably an integer value. However, it need not be, but if it is not an integer value, then the length of $T_{SYNC}$ affects accuracy: the larger $T_{SYNC}$ (relative to $T_{OSC}$), the higher the accuracy.

The smallest number of ticks 22 defines accuracy. In the examples herein described, a resolution of 50 ticks (1 LSB) is assumed. The analogue part of the circuit, i.e. the smallest current, tends to limit the smallest number of ticks 22. A resolution of one tick is theoretically possible.

The accuracy of the synchronisation pulses 4 contributes to the accuracy of the oscillator frequency. An absolute value can be adjusted (e.g., reference frequency source has under typical conditions some variations) by selecting the expected counter value 25. If there is drift (for example, temperature drift and aging) in the frequency of the reference oscillator 5 (FIG. 1), for example, of ±0.5%, then there will be a corresponding drift in the frequency of the oscillator 8.

Figure 8:
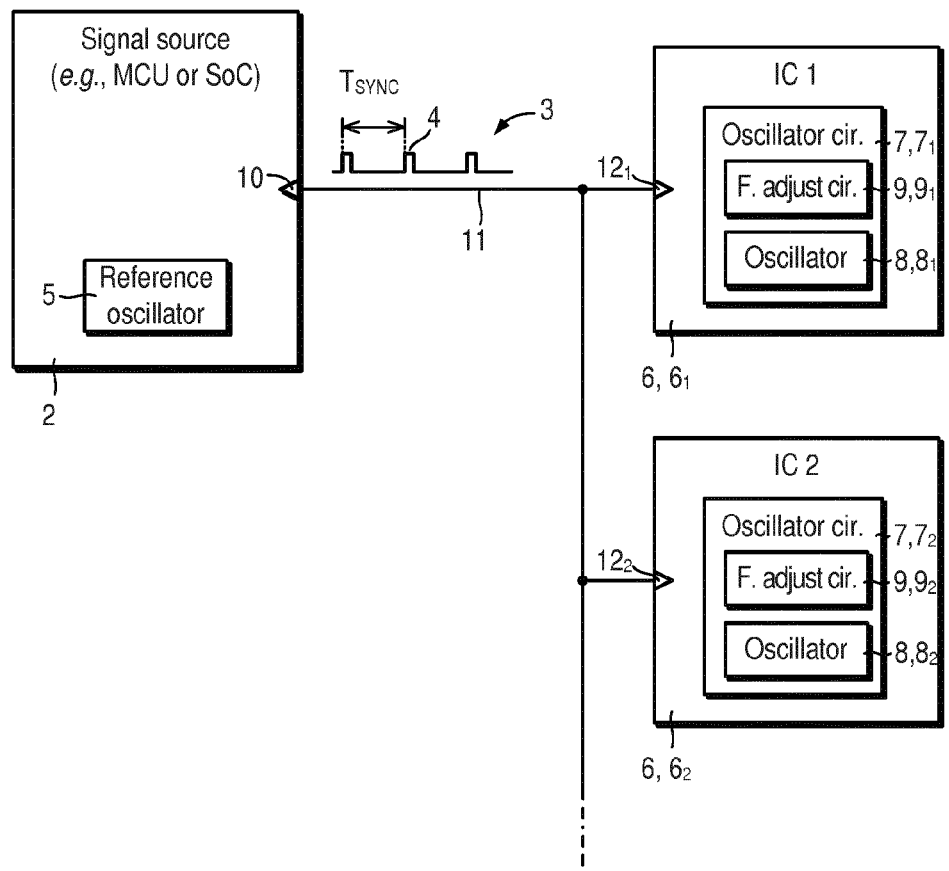
FIG. 8 is a schematic block diagram of a system comprising a source of a synchronisation pulse and at least two monolithic integrated circuits each having a respective local oscillator whose frequency is adjusted using the synchronisation pulse.

Referring to FIG. 8, the synchronisation signal source 2 can be used in a system 1 wherein there are two or more integrated circuits $6_1$, $6_2$ working together, for example, in a ring. The source 2 can be used to synchronise the oscillators $8_1$, $8_2$ of all the integrated circuits $6_1$, $6_2$ so that they all have the same, precise frequency.

Each oscillator $8_1$, $8_2$ is initially set to a frequency f=65.53 MHz with an oscillator period, $T_{OSC}$, of 15.26 ns. The oscillators $8_1$, $8_2$ are rated to have a ±5% error which equates to an error in oscillator period of ±763 μs. The period $T_{SYNC}$ is 500 μs and so the expected number of oscillator periods is (500 μs/15.26 ns)=32,765.

If a first oscillator frequency is 5% higher, then the first oscillator period, $T_{OSC}$, will be 14.53 ns. Thus, the number of counter ticks will be 500 μs/14.53 ns=34,412 resulting in a difference of +1647 ticks. If a second oscillator frequency is 5% lower, then the oscillator period, $T_{OSC}$, will be 16.06 ns. Thus, the number of counter ticks will be 500 μs/16.06 ns=31,133 resulting in a difference of −1632.

The frequency adjustment circuit $9_1$ in the first integrated circuit $6_1$ can reduce the oscillator current by 1,600, by adjusting bit b5, in a single step. The error is thus corrected in only one cycle and the corrected oscillator frequency has remaining error of only 47 ticks, i.e., 0.14%.

The frequency adjustment circuit $9_2$ in the second integrated circuit $6_2$ can increase the oscillator current by 1,600, by adjusting bit b5, in a single step. The error is thus corrected in only one cycle and the corrected oscillator frequency has remaining error of only 32 ticks, i.e., 0.10%.

Thus, the frequency difference between the first and second oscillators $8_1$, $8_2$ can be made to be very small (for example, less than 1%).

It should be noted that integrated circuit(s) 6 can be added or, conversely, a synchronisation source can be added 2 after the integrated circuit(s) 6 have been installed. This provides a "hot plug-in" feature providing improved accuracy.

As explained earlier, the oscillators 8 can be adjusted to have an initial error of 5% and frequency compensation can be used to reduce the error still further, for example, to less than 0.5%. Several different techniques can be used to achieve an initial error of, for example, 5%.

Figure 9:
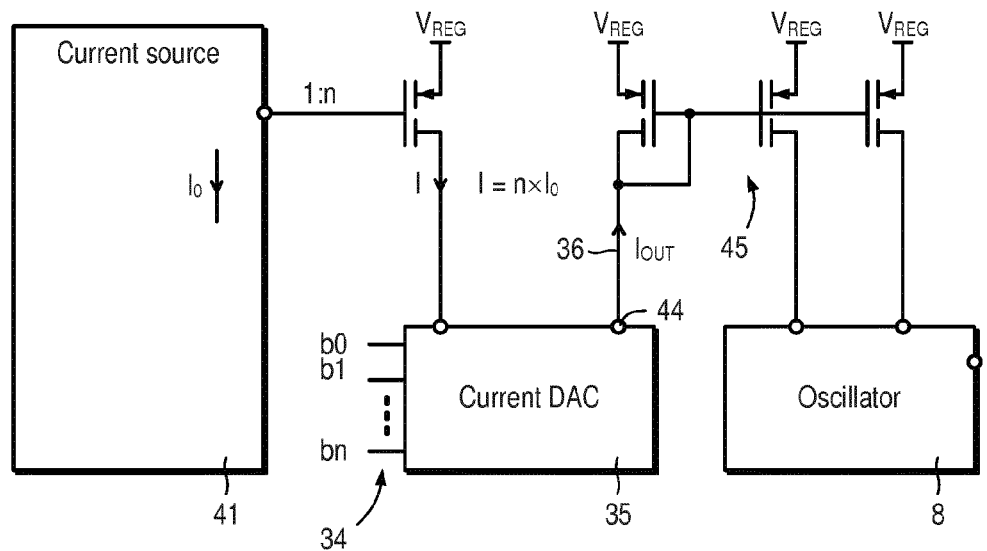
FIG. 9 is a schematic block diagram of a current source, a current digital-to-analogue converter and an oscillator.
Figure 10:
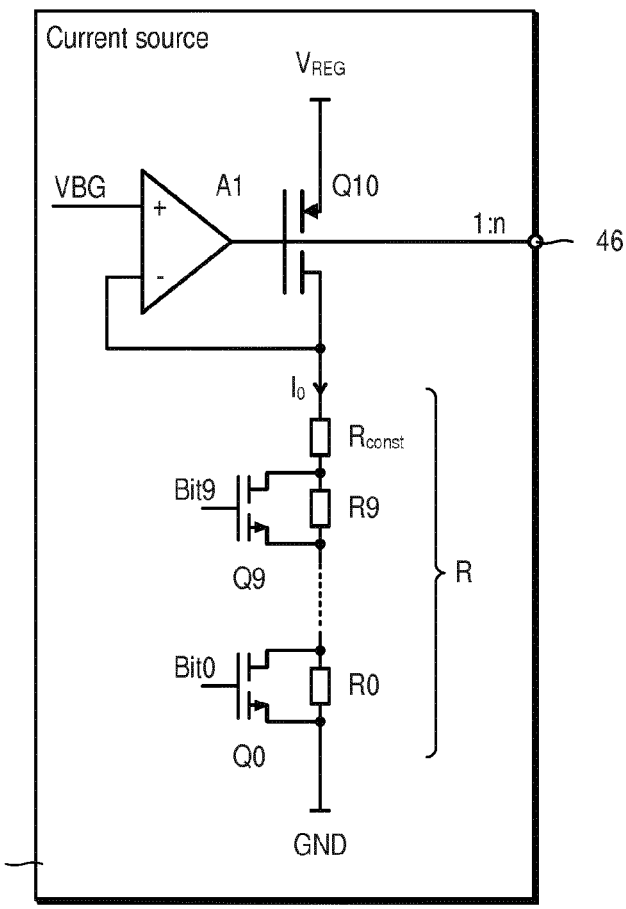
FIG. 10 is schematic diagram of the current source shown in FIG. 9.

Referring to FIGS. 9 and 10, the frequency adjustment circuit 9 includes an example of a current source 41 which generates a reference voltage $I_0$ which can be scaled up by a factor n.

The scaled current is fed to the current DAC 35 which receive a digital control signal 34 (in the form of a bits b0, b1, . . . , bn) and outputs an analogue control signal 36. This is fed to the oscillator 8 via a current mirror 45. As explained, earlier, a current DAC need not be used and, instead, a voltage DAC can be employed.

Referring in particular to FIG. 10, the current source 41 can take the form of a voltage-controlled current source comprising an operational amplifier A1, a set of poly-type resistors R0, . . . , R9 which are arranged in series between ground GND and a first terminal of a reference resistor $R_{CONST}$. Each resistor R0, . . . , R9 has a respective MOSFET Q0, . . . Q9 connected in parallel across the resistor which is controlled by respective trimming bit controls signals Bit0, . . . , Bit9. The output of the operational amplifier A1 is connected to the gate of a MOSFET Q10 whose source is connected to a regulated voltage supply VREG and drain is connected to the second terminal of the reference resistor $R_{CONST}$. The non-inverting input is connected to a voltage reference, for example, the band gap voltage VBG, and the inverting input is connected to the source of the MOSFET Q10. The body of the MOSFET Q10 provides the current for current source 34 via terminal 46. Other configurations of current sources can be used.

Figure 11:
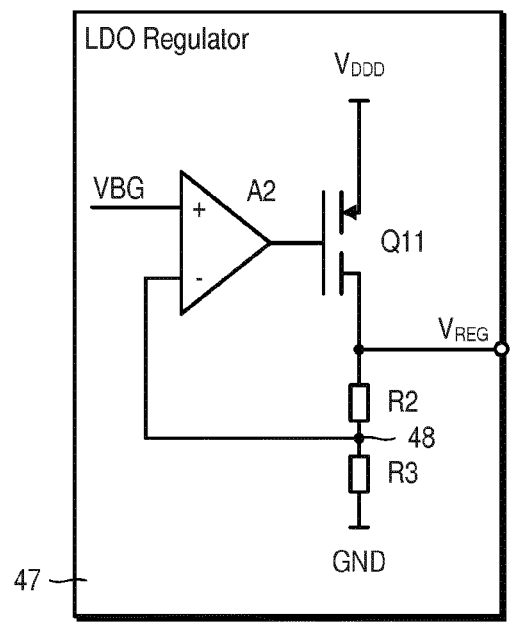
FIG. 11 is schematic diagram of a low-dropout regulator.

Referring to FIG. 11, a low drop-out regulator 47 (or "LDO regulator") can be used to take an unregulated supply voltage VDDD and provide a regulated supply voltage VREG. The LDO regulator 46 comprises an operational amplifier A2, and a MOSFET Q11 and a pair of resistors R2, R3 arranged in series between unregulated supply voltage VDDD and ground GND. The non-inverting input of the operational amplifier A2 is connected to voltage VBG and the inverting input is connected to a tap 48 between the resistors R2, R3. The source of the MOSFET Q11 provides the regulated supply voltage VREG. Other configurations of LDO oscillator can be used.

Figure 12:
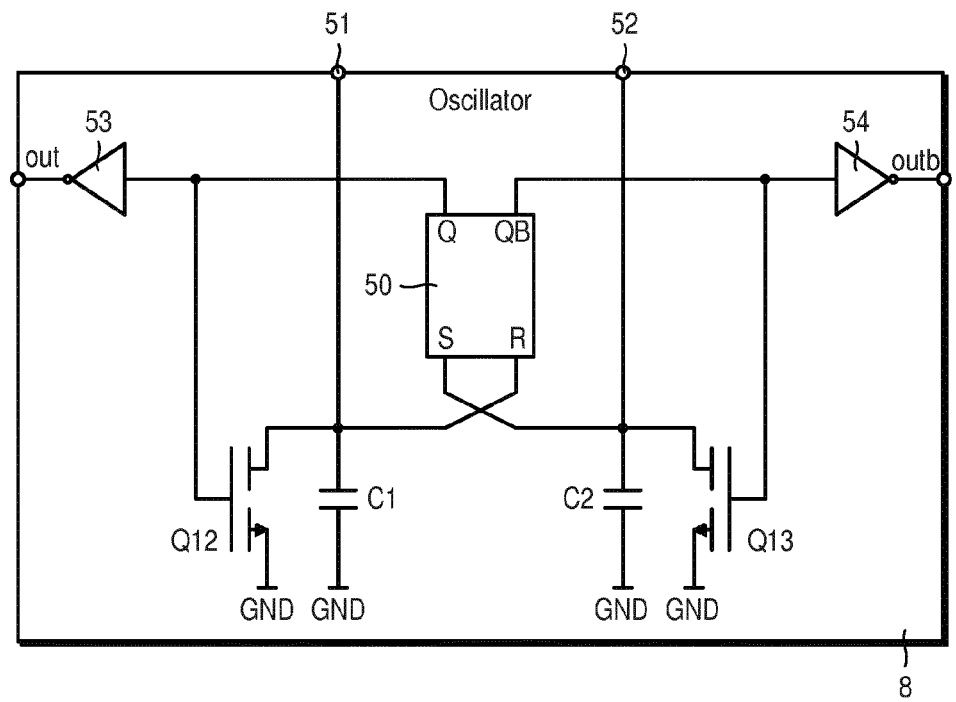
FIG. 12 is schematic diagram of the oscillator shown in FIG. 9.

Referring to FIGS. 9 and 12, the oscillator 8 can take the form of RS flip-flop oscillator comprising a RS flip-flop 50 having set S and reset R terminals, output Q and output complement QB. The control signal 36 is received via first and second input terminals 51, 52. The reset R and set S terminals are connected to first and second capacitors respectively which are connected between the first and second input terminals 51, 52 and ground GND respectively. Each capacitor has a MOSFET Q11, Q12 for connected in parallel across the capacitor C1, C2 and ground GND for controlling charging and discharging of the capacitor C1, C2.

The output Q of the flip-flop 50 feeds to an input of a first inverter 53 and also to the gate of the first MOSFET Q12. Likewise, the complement output QB of the flip-flop 50 feeds to an input of a second inverter 54 and also to the gate of the second MOSFET Q13.

Figure 13:
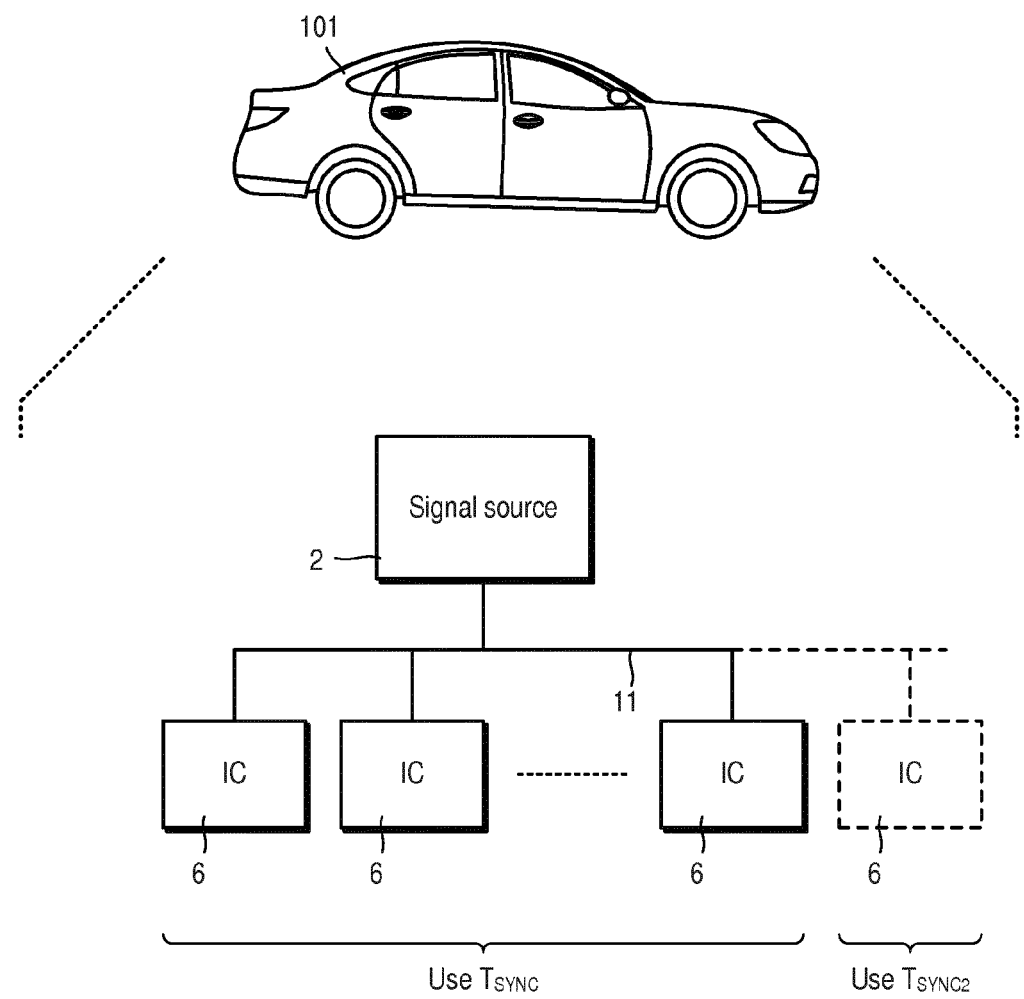
FIG. 13 illustrates a motor vehicle comprising a source of a synchronisation pulse and at least two monolithic integrated circuits each having a respective local oscillator.

Referring to FIG. 13, a motor vehicle 101 is shown.

The motor vehicle 101 includes a system 1 which includes a signal source 2 and a plurality of integrated circuits 6 which may take the form of gate drivers used in, for example, an electronic control unit (not shown) for steering. The signal source 2 is used to synchronise and improve the accuracy of the frequencies of local oscillators 8 (FIG. 8) in the integrated circuits 6.

As mentioned earlier, different integrated circuits 5 can use different synchronisation periods. For example, certain gate drivers may be implemented in silicon carbide and others gate drivers may be implemented in silicon which may involve generation of PWM signals at different frequencies (such as, for example, 20 MHz and 25 MHz). The same physical line 11 can be used to deliver different synchronisation periods to different integrated circuits 5 sharing the same line 11. This can be done in one or more different way. The source 2 can transmit more than set of synchronisation pulses, for example, alternating between first and second sets. Each integrated circuit 6 can include an input signal processing circuit ("a front end") to select (e.g., by filtering) certain pulses from synchronisation signal 3 so as to select one of at least two, different synchronisation periods. The source 2 may select a duty cycle which can be used to define two different periods, namely one defined by the duration of the period (i.e., between adjacent rising edges or between adjacent falling edges) and another by the duration of the pulse (i.e., between a rising edge and a following falling edge or vice versa).

Modifications

It will be appreciated that various modifications may be made to the embodiments hereinbefore described. Such modifications may involve equivalent and other features which are already known in the design, manufacture and use of oscillators and integrated circuits and component parts thereof and which may be used instead of or in addition to features already described herein. Features of one embodiment may be replaced or supplemented by features of another embodiment.

In some embodiments, a digital-to-analogue converter need not be used. For example, the oscillator may be a digital oscillator, i.e., one whose frequency is controlled by a digital signal (as opposed to an analogue signal) which can be used to increase or decrease, for example, the delay of a delay cell.

The synchronisation period and/or the expected number of pulses can be programmable varied.

Other synchronisation periods may be used, such as, for example, 100 µs, 200 µs or 1,000 µs.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. Oscillator circuitry comprising:
    a free-running oscillator for generating pulses at a frequency; and
    a frequency adjustment circuit for adaptively adjusting the frequency of the free-running oscillator, the frequency adjustment circuit comprising:
        a counter configured to count a number of pulses generated by the free-running oscillator; and
        logic configured to:
            compare the number of pulses with an expected number of pulses to determine a difference value;
            determine whether a magnitude of the difference value exceeds a pre-defined threshold value, wherein the pre-defined threshold value is non-zero;
            upon determination that the magnitude of the difference value does not exceed the pre-defined threshold value, adjust the frequency of the free-running oscillator in dependence on the difference value; and
            upon determination that the magnitude of the difference value exceeds the pre-defined threshold value, to adjust the frequency of the free-running oscillator in dependence on another pre-defined value,
    wherein the frequency adjustment circuit is configured, in response to receiving a synchronisation pulse, to trigger an update of the number of pulses to be compared.

2. The oscillator circuitry of claim 1, wherein the logic further comprises:
    a register configured to receive a counter value from the counter, to store the counter value as a stored counter value and to output the stored counter value in response to receiving the synchronisation pulse.

3. The oscillator circuitry of claim 1, wherein the counter is configured to be reset in response to receiving the synchronisation pulse.

4. The oscillator circuitry of claim 1, further comprising:
    a digital input/output pin for receiving the synchronisation pulse from an external source and configured to supply the synchronisation pulse to the frequency adjustment circuit.

5. The oscillator circuitry of claim 1, wherein the logic comprises:
    a comparator for comparing the number of pulses with the expected number of pulses and determining the difference value; and
    a controller for generating a control signal for the free-running oscillator in dependence on the difference value.

6. The oscillator circuitry of claim 5, further comprising:
a digital-to-analogue converter for converting a digital value of the control signal into an analogue value.

7. The oscillator circuitry of claim 1, wherein the free-running oscillator is a digitally-controlled oscillator.

8. The oscillator circuitry of claim 1, wherein the free-running oscillator is an analogue-controlled oscillator.

9. The oscillator circuitry of claim 1, further comprising:
an input signal processing circuit to select certain pulses or certain features of pulses from a synchronisation signal so as to select one of at least two, different synchronisation periods.

10. The oscillator circuitry of claim 1 further comprising:
a sequencer configured, in response to receiving the difference value, to determine a size and/or a direction of change of frequency and to output data for generating a control signal.

11. The oscillator circuitry of claim 10, wherein the sequencer is configured to identify an error condition which depends on the number of pulses and, in response to identifying the presence of the error condition, not to adjust the frequency of the free-running oscillator.

12. An integrated circuit comprising the oscillator circuitry of claim 1.

13. The integrated circuit of claim 12, which is digital integrated circuit or a mixed-signal integrated circuit.

14. The integrated circuit of claim 12, which is a gate driver.

15. A system comprising:
a source of a synchronisation signal containing synchronisation pulses for defining a synchronisation period, the source comprising:
a reference oscillator; and
an output for the synchronisation signal, the synchronisation pulses generated using the reference oscillator; and
at least one integrated circuit of claim 12 configured to receive the synchronisation signal and to use the synchronisation pulses to count the number of pulses generated by the free-running oscillator.

16. The system of claim 15, wherein the source is configured to transmit an expected value to the at least one integrated circuit.

17. The system of claim 16, wherein the expected value is programmable.

18. The system of claim 15, wherein the source is configured to generate first and second sets of synchronisation pulses having first and second different synchronisation periods.

19. The system of claim 15 comprising at least two integrated circuits having synchronised oscillators having frequencies which lie within 5%, 2% or 1%.

20. The system of claim 15, wherein the source is an integrated circuit comprising at least one processor.

21. The system of claim 20, wherein the source is a microcontroller or a system-on-a-chip.

22. A vehicle or plant comprising the system of claim 15.

23. A motor vehicle comprising the system of claim 15.

24. A system comprising:
a source of a synchronisation signal containing synchronisation pulses for defining a synchronisation period, the source comprising:
a reference oscillator; and
an output for the synchronisation signal, the synchronisation pulses generated using the reference oscillator; and
at least two integrated circuits of claim 12 each configured to receive the synchronisation signal and to use the synchronisation pulses to count the number of pulses generated by the free-running oscillator.

25. The oscillator circuitry of claim 1, wherein the frequency adjustment circuit is configured to be triggered by a rising edge of the synchronisation pulse.

26. The oscillator circuitry of claim 1, wherein the free-running oscillator is a signal-controlled oscillator for generating pulses at a frequency which depends on a control signal.

27. The oscillator circuitry of claim 26, wherein the signal-controlled oscillator is a current-controlled oscillator.

28. The oscillator circuitry of claim 26, wherein the signal-controlled oscillator is a voltage-controlled oscillator.

29. A method of adjusting a free-running oscillator generating pulses at a frequency, the method comprising:
counting a number of pulses generated by the free-running oscillator;
comparing the number of pulses with an expected number of pulses to determine a difference value;
determining whether a magnitude of the difference value exceeds a pre-defined threshold value, wherein the pre-defined threshold value is non-zero;
adjusting the frequency of the free-running oscillator in dependence upon:
the difference value when the magnitude of the difference value does not exceed the pre-defined threshold value; or
another predefined value when the magnitude of the difference value exceeds the pre-defined threshold value;
in response to receiving a synchronisation pulse, triggering an update of the number of pulses to be compared.

30. The method of claim 29, wherein adjusting the frequency of the free-running oscillator comprises generating a control signal for the free running oscillator in dependence on the difference value.

* * * * *